US006222358B1

(12) United States Patent
Wottrich

(10) Patent No.: US 6,222,358 B1
(45) Date of Patent: Apr. 24, 2001

(54) AUTOMATIC CIRCUIT LOCATOR

(75) Inventor: Joachim Wottrich, La Grange Park, IL (US)

(73) Assignee: NTC, Inc., Morris, IL (US)

( * ) Notice: Subject to any disclaimer, the term of this patent is extended or adjusted under 35 U.S.C. 154(b) by 0 days.

(21) Appl. No.: 09/121,790

(22) Filed: Jul. 24, 1998

Related U.S. Application Data

(60) Provisional application No. 60/053,757, filed on Aug. 25, 1997.

(51) Int. Cl.[7] ................................................. G01R 19/00
(52) U.S. Cl. ............................ 324/67; 324/326; 324/424
(58) Field of Search ............................... 324/67, 66, 133, 324/326, 526, 529, 527, 424, 543, 508, 512, 539, 555, 522; 702/59

(56) References Cited

U.S. PATENT DOCUMENTS

| | | | |
|---|---|---|---|
| 3,916,301 | * | 10/1975 | Vild et al. ............................... 324/37 |
| 4,642,556 | * | 2/1987 | Pecukonis ............................... 324/67 |
| 4,979,070 | * | 12/1990 | Bodkin .................................... 361/42 |
| 5,422,564 | * | 6/1995 | Earle et al. ............................. 324/67 |
| 5,590,012 | * | 12/1996 | Dollar, II .............................. 361/113 |
| 5,969,516 | * | 10/1999 | Wottrich ................................. 324/67 |

* cited by examiner

Primary Examiner—Christine Oda
Assistant Examiner—Subhash Zaveri
(74) Attorney, Agent, or Firm—Wallenstein & Wagner

(57) ABSTRACT

The present invention relates to an electronic system for identifying a single power line from a plurality of power lines having transmitting means for transmitting an identification signal on the single power line to produce a magnetic field with a strength around the single power line, sensing means for sensing the strength of a magnetic field around each of the plurality of power lines wherein the strengths of the magnetic fields range from a smallest value to a largest value, storing means for storing the largest value, and alert means for alerting a user when the sensing means senses the largest value. Also disclosed is a method of using the device.

19 Claims, 4 Drawing Sheets

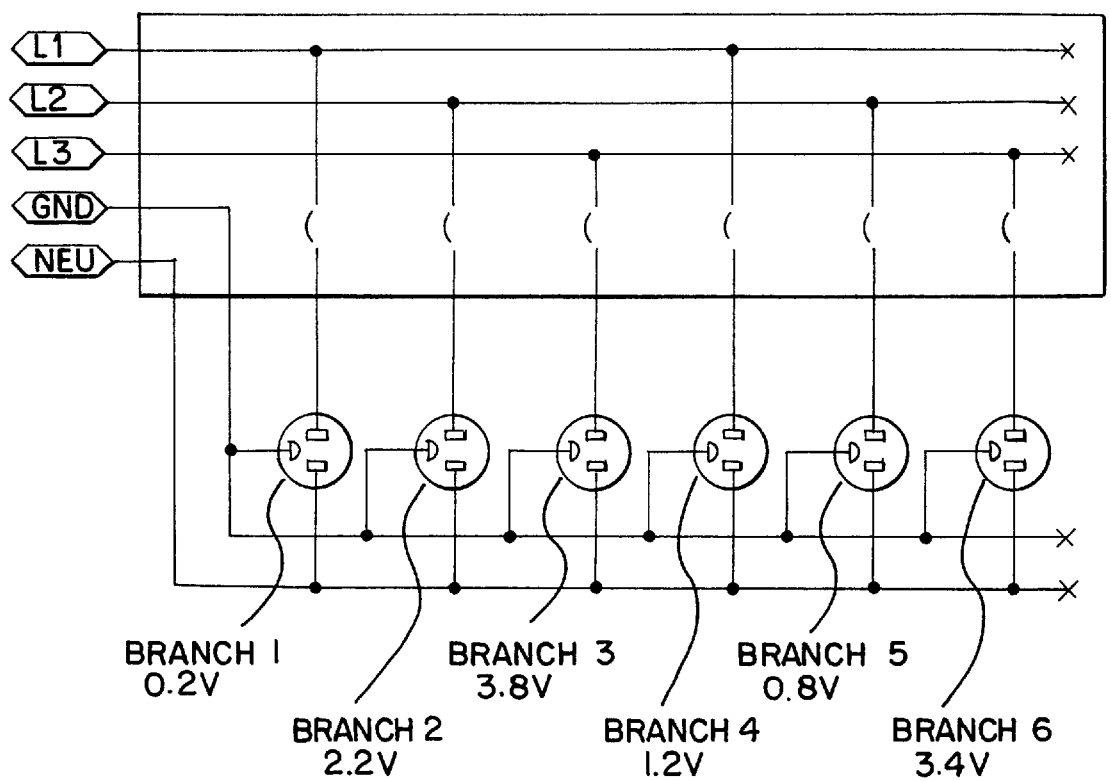

AUTOMATIC CIRCUIT LOCATOR

RELATED APPLICATIONS

This Application claims the benefit of U.S. Provisional Application No. 60/053,757, filed on Aug. 25, 1997.

DESCRIPTION

Technical Field

The present invention relates generally to AC power line testing equipment and, more particularly, to an AC power circuit identifying device. Specifically, the present invention is used to identify the circuit interrupter device associated with a particular power outlet receptacle, thereby performing a calibration process automatically.

BACKGROUND OF THE INVENTION

When work is performed on an electrical system in a building or facility, it is necessary to trace and identify which circuit interrupter device (e.g., circuit breaker or fuse) is supplying power to a particular power outlet receptacle or electrical component. Manual identification of the fuse or circuit breaker can be accomplished by removing each fuse or opening each circuit breaker, thereby disrupting the power flow through the circuit. Each outlet must subsequently be examined to determine whether the power to the outlet has been disconnected. This method is not only time consuming, but also may not be feasible in situations where it would be hazardous to interrupt the power flow to certain outlets, e.g., in a hospital or in an environment where computers are in use with no backup power.

Alternatively, a variety of circuit testers are available for identifying the fuse or circuit breaker that is supplying power to a particular outlet receptacle. These testers employ an assortment of techniques to distinguish one circuit breaker from the rest. For example, the testers disclosed in U.S. Pat. Nos. 4,906,93 8 and 5,497,094 use a relaxation oscillator to apply an identification signal comprising a large amplitude current pulse of very short duration to the circuit. A schematic diagram of the transmitter 10 disclosed in U.S. Pat. No. 4,906,938 is shown in FIG. 1. The terminals 12, 14 of transmitter 10 are connected to the outlet or light fixture to be tested. Diode 16 acts as a half-wave rectifier. Specifically, if the voltage across diode 16 is positive, diode 16 acts as a short circuit, and if the voltage across diode 16 is negative, diode 16 acts as an open circuit. Sidac 18 is a short circuit when the voltage thereacross reaches its threshold value of 120–135 volts, and is an open circuit when the current through sidac 18 drops below the minimum holding current of the device. Thus, in this arrangement, sidac 18 acts as a trigger switch.

If a conventional power line voltage is applied to transmitter 10, sidac 18 will initially go into conduction when the line voltage reaches approximately 120 volts. This causes capacitor 20 to immediately charge to the line voltage, resulting in a large amplitude current pulse which is used to identify the circuit. Sidac 18 will continue conducting until the current approaches 0 amps, i.e., approximately 50–150 milliamps, which occurs near the peak of the power line voltage. When sidac 18 is switched off, capacitor 20 will be charged at a voltage level close to the peak voltage, i.e., approximately 150 volts, and can only discharge through resistor 22. Due to the relatively large resistance of resistor 22, the discharge of capacitor 20 will be slow.

Because capacitor 20 remains charged at approximately 150 volts, as the line voltage decreases from 150 volts to 0 volts and continues through its negative cycle, the voltage across diode 16 is negative. Thus, diode 16 remains an open circuit and capacitor 20 continues to discharge slowly through resistor 22.

During the next cycle, diode 16 becomes a short circuit when the line voltage surpasses the charge on the capacitor 20. Sidac 18 will remain an open circuit, however, because the voltage across sidac 18, which is the difference between the line voltage and the voltage across capacitor 20, will not reach its threshold value. Thus, transmitter 10 will not conduct any current until the voltage across capacitor 20 has time to discharge through resistor 22, which does not occur for a number of cycles. This results in a frequency of current spikes less than the power line frequency of 60 hertz.

The identification signal develops a strong magnetic field that will likely be sensed in the vicinity of a number of circuit interrupter devices, including the one that is actually connected to the transmitter. In order to isolate the specific circuit interrupter device, the end user must manually adjust the gain or amplifier of the receiver, and re-scan the circuit interrupter devices with the receiver. This procedure is repeated until only one circuit breaker triggers a response by the receiver. The circuit interrupter device connected to the transmitter may also be identified by monitoring a signal strength meter or bar-graph display. These devices require the user to select the circuit interrupter device with the strongest magnetic field. Receivers which require manual adjustment of the gain or amplifier of the receiver, and signal strength meters having analog or digital readouts can be quite difficult to use, especially if the end user has no prior experience with such instruments.

SUMMARY OF THE INVENTION

The present invention is directed to an electronic system for identifying the associated dedicated circuit interrupting device. Particularly, a transmitting device is plugged into the power outlet receptacle in question, and an identification signal is transmitted over the circuit wiring from the electrical panel.

Unlike most existing circuit identifiers currently on the market, the automatic circuit locator of the present invention does not require input from the end user to identify the correct circuit interrupting device. The automatic circuit locator performs the calibration process, thereby eliminating the need for the end user to do so.

According to a first aspect of the present invention, an identification signal is transmitted from an outlet to produce a magnetic field around a plurality of power lines. A receiver senses the strength of the magnetic fields around the power lines, and stores the largest value. The user is alerted when the receiver senses the stored value.

Other features and advantages of the invention will be apparent from the following detailed description taken in conjunction with the drawings.

BRIEF DESCRIPTION OF THE DRAWINGS

FIG. 5 illustrates an example of an AC wiring system.

DETAILED DESCRIPTION OF THE PREFERRED EMBODIMENT

While this invention is susceptible of embodiments in many different forms, there will herein be described in detail preferred embodiments of the invention with the understanding that the present disclosure is to be considered as exemplifications of the principles of the invention and is not intended to limit the broad aspects of the invention to the embodiments illustrated.

Figure 1:
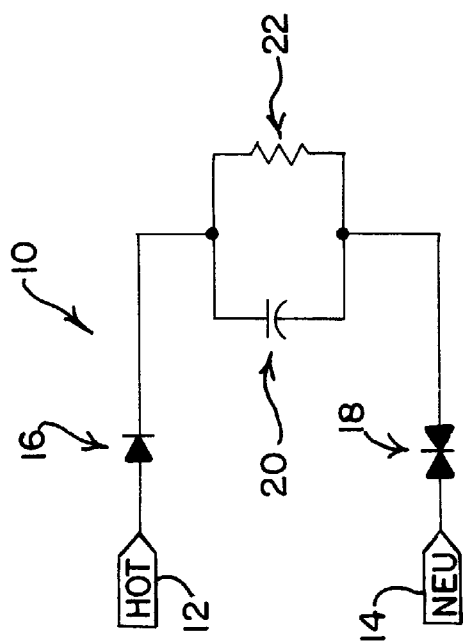
FIG. 1 is a schematic diagram of a conventional transmitting device.
Figure 2:
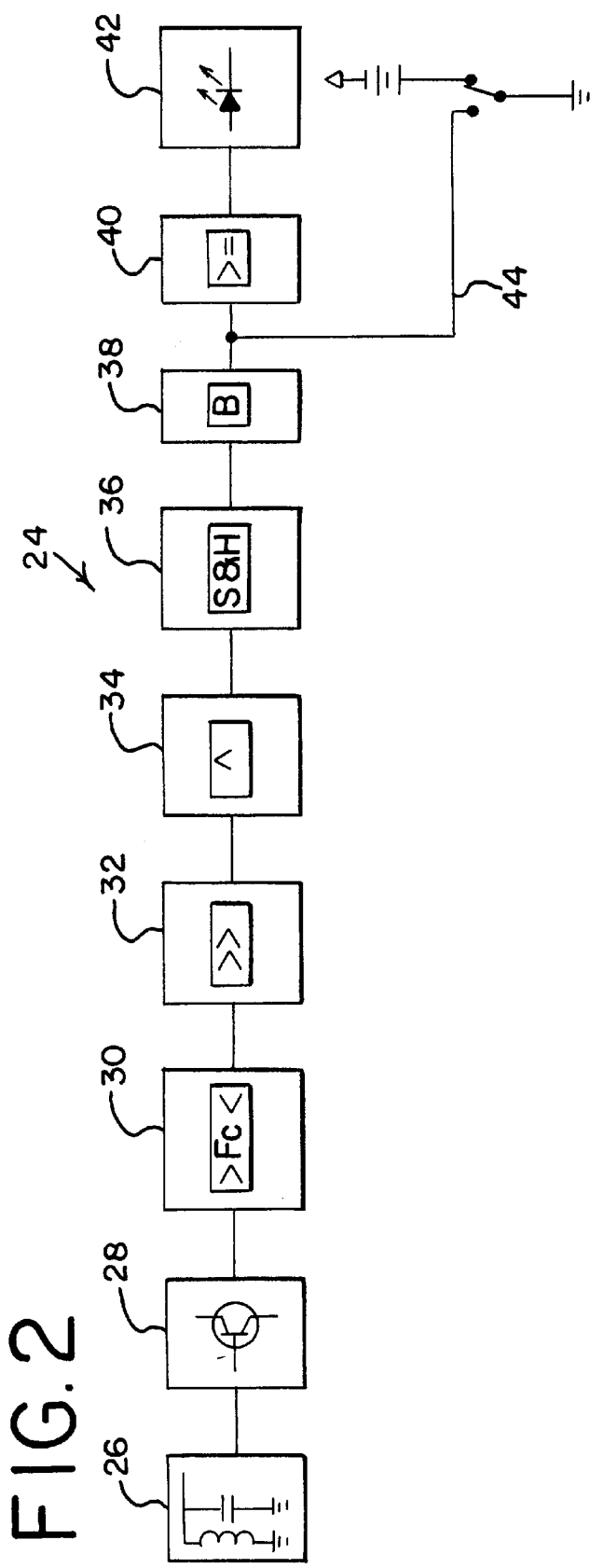
FIG. 2 is a block diagram of a first embodiment of a receiving device in accordance with the present invention.

FIG. 2 is a block diagram of a receiving device 24 in accordance with the present invention. The first section of the receiving device 24 is a parallel tuned tank 26. The parallel tank 26 is broadly tuned to the resonance frequency of the magnetic field created by the identification signal on the power line. The identification signal is formed on the power line by the transmitter or signal feeder 10. The signal measured by the parallel tank 26 is relatively small, in the millivolt range. After a signal is measured, it is amplified by a transistor preamplifier 28, which is a high gain preamplifier.

Although the parallel tank is tuned to the frequency of the identification signal, it will pick up other signals if they appear as a sharply rising short duration pulse, e.g. noise, that may be present on the line. These other signals will be amplified by the preamplifier 28. To avoid further processing, the amplified signal from the preamplifier 28 is passed through a narrow band-pass filter 30. The frequency band of the narrow band-pass filter 30 corresponds to the frequency of the magnetic field on the power line. Thus, any extraneous noise at frequencies outside the range of the filter 30 will be removed.

The filtered signal is AC coupled to a booster amplifier 32. This amplifier 32 is configured as a high impedance, closed-loop AC follower. To achieve the high input impedance, a bootstrap technique is incorporated.

The resulting signal is an outcome of the strength of the magnetic field. Because the strength of the magnetic field will fluctuate, the signal from the booster amplifier 32 is applied to a peak detector 34 to provide a consistent measurement for the strength of the magnetic field.

Comparator 40 compares a signal from the buffer 38 with the reference signal stored by the receiving device 24. If the incoming signal is greater or equal to the stored reference value, display 42 generates an alerting signal. If the incoming signal exceeds the reference value, the incoming signal replaces the reference value. A reset 44 shown in the receiving device 24 of FIG. 2 resets the initial reference voltage to begin a new scan.

Figure 3:
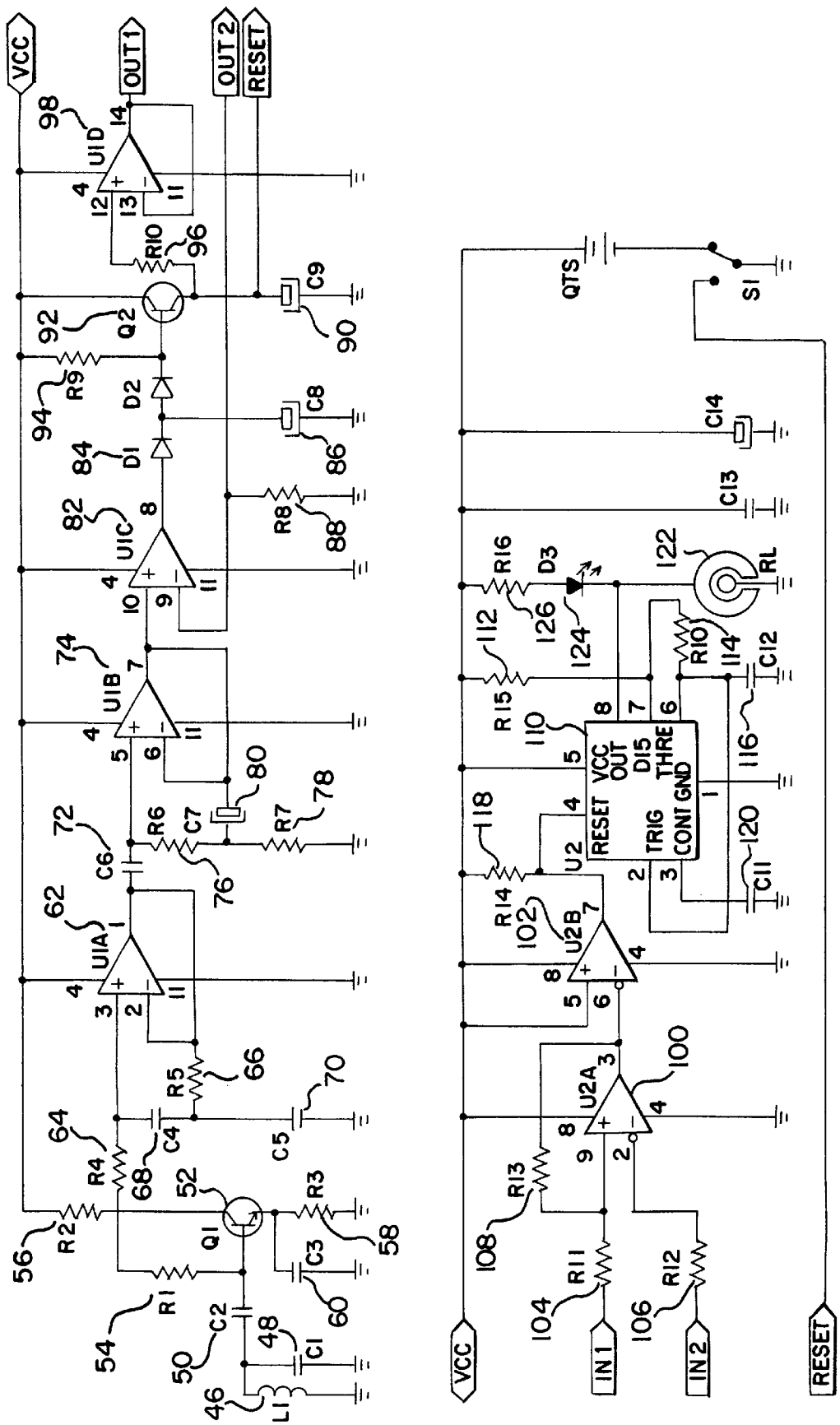
FIG. 3 is a schematic diagram of the receiving device of FIG. 2.

FIG. 3 is a schematic diagram of the receiving device 24 of FIG. 2. As shown in FIG. 3, the parallel tuned tank 26 comprises a pick-up coil 46 and a capacitor 48. The signal is AC coupled from the parallel tuned tank 26 through capacitor 50, to the transistor preamplifier 28. The transistor preamplifier 28 is built around a general purpose NPN transistor 52, which is configured in association with its supporting component resistors 54, 56, 58 and capacitor 60 as a common emitter preamplifier with AC and DC feedback for biasing the transistor 52. Emitter resistor 58 and its capacitor 60 stabilize the preamplifier 28.

The narrow band-pass filter 30 comprises operational amplifier 62, resistors 64, 66 and capacitors 68, 70. The filtered signal is AC coupled by capacitor 72 to the booster amplifier 32. The booster amplifier 32 comprises operational amplifier 74, resistors 76,78 and capacitor 80. The peak voltage detector 34 comprises operational amplifier 82, diode 84, capacitor 86 and resistor 88. This stage is in many respects similar to a "sample and hold" circuit 36. Diode 84 conducts whenever the input voltage is greater than the output voltage, thus making the output voltage equal to the peak value of the input voltage. The sample and hold 36 holds the output voltage by charging the holding capacitor 86 to the level of the output voltage. Resistor 88 shunts capacitor 86 to signal-ground, and is thus, the only discharge path for capacitor 86. The newly produced DC signal, which represents the amplitude of the magnetic field is further stored in a large storage capacitor 90. Since a low impedance current source is needed to charge the storage capacitor 90, an additional transistor 92 is added to the output. When the output of the peak voltage detector 34 rises, current is passed to the base of transistor 92, thereby forcing the collector-emitter path of the transistor 92 into conduction and charging capacitor 90 rapidly. Resistor 94 helps transistor 92 to bias on. Transistor 92, resistor 94, resistor 96, capacitor 90 and operational amplifier 98 comprise the buffer 38 of the circuit. Operational amplifier 98 is configured as a high impedance follower to avoid loading the storage capacitor 90 and giving low drift along with a low output resistance.

Since storage capacitor 90 is relatively large, resistor 96 is an isolation resistor between the capacitor 90 and the input of the follower 98. This will insure that the operational amplifier 98 will not be damaged by shorting the output or abruptly shutting down the supplies when the capacitor 90 is charging.

Comparator 40 is a two stage comparator comprising operational amplifiers 100, 102. Resistors 104, 106 serve as current limiters, while resistor 108 is part of a feedback loop. The output signal obtained from the buffer 38 serves as a reference signal and is fed into the inverting input of the first comparator stage 100, while the output of the peak voltage detector 34 is fed through the non-inverting input of the first comparator stage 100 and is thus the instantaneous DC equivalent for the measured strength of the magnetic field. As soon as this signal equals or exceeds the reference voltage, the output of the first comparator stage 100 goes high, thereby forcing the second comparator stage 102, which serves as a buffer, to go high as well.

The display subcircuit 42 is built around a timer 110, such as a 555 timer, which is arranged as a free running or astable multi-vibrator whose frequency is determined by resistors 112, 114 and capacitor 116. If the output of the second comparator 102 goes high, it pulls the reset pin of the timer 110 to the positive supply voltage, supported by resistor 118, which acts as a pull-up resistor. Capacitor 120 connected to the modulation pin of the timer 110 provides this subcircuit 42 with somewhat more stability. If the reset pin is pulled-up to the positive supply voltage, the oscillator operates with its pre-determined frequency. This causes piezo 122 to sound and LED 124 to fire an intermitting pattern equal to the multi-vibrator frequency. Since LED 124 serves as a power-on indicator as well, it will dim as soon as voltage is supplied to the circuit. Resistor 126 allows only a very small amount of current to flow to LED 124. Thus, LED 124 does not shine very brightly. Diode 128 prevents current from feeding back to the output of timer 110.

Figure 4:
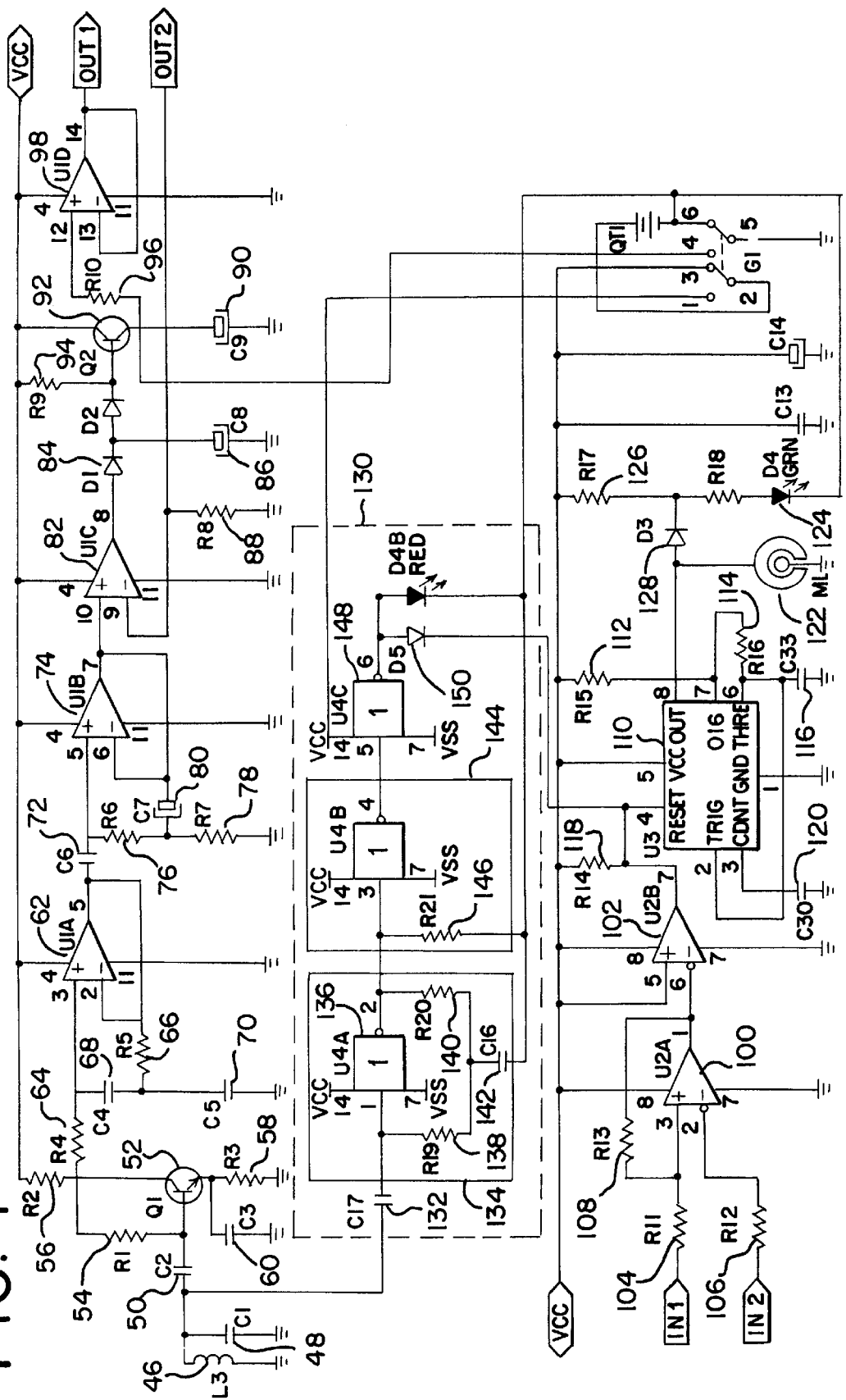
FIG. 4 is a schematic diagram of a second embodiment of a receiving device in accordance with the present invention.

If both the "NEUTRAL" and the "GROUND" terminals of the transmitter are not connected, but the "HOT" terminal is connected, no current will flow through the transmitter. Thus, one may incorrectly assume that the outlet is not energized, and therefore, believe it is safe to work on the outlet. The addition of an AC voltage sensor 130 in the receiving device 24, as shown in FIG. 4, will allow a user to detect this situation.

The circuit is built around a CMOS hex invertor. The resonance tank of the receiver is connected through capacitor 132 to the first input stage 134 of the AC voltage sensor 130. While capacitor 32 ensures that the relatively strong 60 Hz magnetic field of the AC power itself is rejected from further travel, capacitor 132 only passes the 60 Hz signal. Operational amplifier 136, resistors 138, 140 and capacitor 142 comprise an oscillator circuit which is triggered when a sufficient voltage level is applied to the input of this stage.

The oscillating output signal is fed to the second stage 144 of the AC voltage sensor 130 and resistor 146 integrates the oscillating signal so that it appears as a logical "LOW" level. The third stage 148 of the AC voltage sensor 130 inverts this signal, resulting in a logical "HIGH" level of the output when a 60 Hz field is sensed. The output of the AC voltage sensor 130 is connected to the reset pin of the timer 110 through diode 150, which isolates the branch circuit from the rest of the arrangement. If the signal goes "HIGH," the timer circuit 110 will be activated and thus, the LED will be illuminated and the buzzer will sound. The switch 152 has been changed to a DPDT part with three positions. The center position switches the unit off and resets the storing capacitor 90 in the same manner as before, while the first position switches the circuit identifier on, and the third, momentary contact position activates the voltage sensor.

The identification signal typically travels from the specific circuit breaker to a connecting bus-bar and onto other circuit breakers within the load center. The strength of the magnetic fields, however, diminishes due to additional transition resistance rising on the mechanical connections between the breakers and the busbar. Thus, the specific circuit breaker that provides power to the branch circuit to which a transmitter or signal feeder 10 is connected has the strongest magnetic field.

The basic operation of the automatic circuit locator of the present invention requires the transmitter to be plugged into a receptacle outlet. An LED on the transmitter will indicate whether the transmitter is reading voltage from the outlet. To identify the circuit breaker or fuse supplying the power to the receptacle, two scans of all circuit breakers will be necessary. During the initial scan, the receiver will measure the strengths of the magnetic fields associated with each of the interrupter devices, and store the value of the largest strength measured. During the second scan, the receiver will alert the user when it measures the value stored.

The initial reference voltage stored in the receiver is approximately 100 mV (0.1 V). Every value measured from the interrupter devices is compared to the reference signal. If the incoming signal is equal to or greater than the stored reference signal, an alert signal will be generated. If the incoming signal exceeds the reference value, the incoming signal becomes the reference value. After all circuit interrupter devices are scanned, the value stored in the receiver will contain the highest value measured during the scanning procedure. The circuit breaker possessing the highest value is the circuit breaker supplying power to the transmitter or signal feeder. During the second scan, all of the signals will be below the stored reference value, except for the signal originating from the circuit breaker supplying power to the transmitter or signal feeder.

For example, if a transmitter is connected to branch circuit 3 of FIG. 5, the first scan from branch 1 to branch 6 will result in the following readings:

| Branch | $V_{in}$ | $V_{stored}$ | Result | Action |
|---|---|---|---|---|
| 1 | 0.2 V | 0.1 V | $V_{in} > V_{stored}$ | Alert user; update $V_{stored}$ |
| 2 | 2.2 V | 0.2 V | $V_{in} > V_{stored}$ | Alert user; update $V_{stored}$ |
| 3 | 3.8 V | 2.2 V | $V_{in} > V_{stored}$ | Alert user; update $V_{stored}$ |
| 4 | 1.2 V | 3.8 V | $V_{in} < V_{stored}$ | No Action |
| 5 | 0.8 V | 3.8 V | $V_{in} < V_{stored}$ | No Action |
| 6 | 3.4 V | 3.8 V | $V_{in} < V_{stored}$ | No Action |

The second scan from branch 1 to branch 6 will result in the following readings:

| Branch | $V_{in}$ | $V_{stored}$ | Result | Action |
|---|---|---|---|---|
| 1 | 0.2 V | 3.8 V | $V_{in} < V_{stored}$ | No Action |
| 2 | 2.2 V | 3.8 V | $V_{in} < V_{stored}$ | No Action |
| 3 | 3.8 V | 3.8 V | $V_{in} = V_{stored}$ | Alert |
| 4 | 1.2 V | 3.8 V | $V_{in} < V_{stored}$ | No Action |
| 5 | 0.8 V | 3.8 V | $V_{in} < V_{stored}$ | No Action |
| 6 | 3.4 V | 3.8 V | $V_{in} < V_{stored}$ | No Action |

After the first scan, the receiver will only generate an alert signal when the receiver is measuring the magnetic field of branch 3. The value of the reference voltage must be reset for all subsequent scans. Because the receiver includes "power on reset," the reference voltage may be reset by simply switching the receiving device off and on.

In the following example, the transmitter remains connected to branch circuit 3 of FIG. 5. The branch circuits, however, will be scanned from branch 6 to branch 1, resulting in the following readings:

| Branch | $V_{in}$ | $V_{stored}$ | Result | Action |
|---|---|---|---|---|
| 6 | 3.4 V | 0.1 V | $V_{in} > V_{stored}$ | Alert user; update $V_{stored}$ |
| 5 | 0.8 V | 3.4 V | $V_{in} < V_{stored}$ | No Action |
| 4 | 1.2 V | 3.4 V | $V_{in} < V_{stored}$ | No Action |
| 3 | 3.8 V | 3.8 V | $V_{in} > V_{stored}$ | Alert user; update $V_{stored}$ |
| 2 | 2.2 V | 3.8 V | $V_{in} < V_{stored}$ | No Action |
| 1 | 0.2 V | 3.8 V | $V_{in} < V_{stored}$ | No Action |

The second scan from branch 6 to branch 1 would result in the following readings:

| Branch | $V_{in}$ | $V_{stored}$ | Result | Action |
|---|---|---|---|---|
| 6 | 3.4 V | 3.8 V | $V_{in} < V_{stored}$ | No Action |
| 5 | 0.8 V | 3.8 V | $V_{in} < V_{stored}$ | No Action |
| 4 | 1.2 V | 3.8 V | $V_{in} < V_{stored}$ | No Action |
| 3 | 3.8 V | 3.8 V | $V_{in} = V_{stored}$ | Alert |
| 2 | 2.2 V | 3.8 V | $V_{in} < V_{stored}$ | No Action |
| 1 | 0.2 V | 3.8 V | $V_{in} < V_{stored}$ | No Action |

Thus, both of the above examples result in the identification of the correct branch.

It will be understood that the invention may be embodied in other specific forms without departing from the spirit or central characteristics thereof. The present embodiments, therefore, are to be considered in all respects as illustrative and not restrictive, and the invention is not to be limited to the details given herein.

What I claim is:

1. An electronic system for identifying a single power line from a plurality of power lines, the electronic system comprising:

transmitting means for transmitting an identification signal on the single power line to produce a magnetic field with a strength around the single power line;

sensing means for sensing the strength of a magnetic field around each of the plurality of power lines, wherein the strengths of the magnetic fields range from a smallest value to a largest value;

storing means for storing the largest value; and alert means for alerting a user when the sensing means senses the largest value.

2. The electronic system as claimed in claim 1, further comprising:
   filtering means for filtering frequencies outside a frequency band from the strengths of the magnetic fields.
3. The electronic system as claimed in claim 1, further comprising:
   amplifying means for amplifying the strengths of the magnetic fields.
4. The electronic system as claimed in claim 1, further comprising:
   comparing means for comparing the largest value in the storing means to the strength of the magnetic field sensed by the sending.
5. A receiving device in an electronic system for identifying a single power line from a plurality of power lines, wherein each of the plurality of power lines has a magnetic field and each magnetic field has a strength, the receiving device comprising:
   sensing means for sensing the strength of the magnetic fields around each of the plurality of power lines, wherein the strengths of the magnetic fields range from a smallest value to a largest value;
   storing means for storing the largest value; and
   alert means for alerting a user when said sensing means senses the largest value.
6. The receiving device as claimed in claim 5, further comprising:
   filtering means for filtering frequencies outside a frequency band from the strengths of the magnetic fields.
7. The receiving device as claimed in claim 5, further comprising:
   amplifying means for amplifying the strengths of the magnetic fields.
8. The electronic system as claimed in claim 1, further comprising:
   comparing means for comparing the largest value stored in the storing means to the strength of the magnetic field sensed by the sensing means.
9. A method for identifying a single power line from a plurality of power lines, comprising the steps of:
   transmitting an identification signal on the single power line to produce a magnetic field with a strength around the single power line;
   sensing the strength of a magnetic field around each of the plurality of power lines, wherein the strengths of the magnetic fields range from a smallest value to a largest value;
   storing the largest value; and
   alerting a user when the sensing means senses the largest value.
10. The method as claimed in claim 9, further comprising the step of:
    filtering frequencies outside a frequency band from the strengths of the magnetic fields.
11. The method as claimed in claim 9, further comprising the step of:
    amplifying the strengths of the magnetic fields.
12. The method as claimed in claim 9, further comprising the step of:
    comparing the largest value stored to the strengths of the magnetic fields sensed.
13. A method for identifying a single power line from a plurality of power lines, wherein each of the plurality of power lines has a magnetic field and each magnetic field has a strength, comprising the steps of:
    sensing the strength of the magnetic fields around each of the plurality of power lines, wherein the strengths of the magnetic fields range from a smallest value to a largest value;
    storing the largest value; and
    alerting a user when said sensing means senses the largest value.
14. The method as claimed in claim 13, further comprising the step of:
    filtering frequencies outside a frequency band from the strengths of the magnetic fields.
15. The method as claimed in claim 13, further comprising the step of:
    amplifying the strengths of the magnetic fields.
16. The method as claimed in claim 13, further comprising the step of:
    comparing the largest value stored to the strengths of the magnetic fields sensed.
17. A device for identifying a single power line from a plurality of power lines comprising:
    a transmitter which transmits a signal on the single power line at a transmitter frequency; and
    a receiver comprising:
      a sensor; and
      a signal storage circuit;
    wherein the sensor senses a magnetic field around each respective power line and stores a value associated with the intensity of the magnetic field in the signal storage circuit when the sensed value of magnetic field exceeds a previously stored value of magnetic field.
18. The device of claim 17 further comprising a band pass filter having an upper and lower cutoff frequency lower and greater than, respectively, the transmitter frequency.
19. The device of claim 17 further comprising a comparator which compares the value stored in the signal storage circuit to the strength of a magnetic field sensed by the sensor.

* * * * *